United States Patent
Cao

(10) Patent No.: US 11,646,540 B2
(45) Date of Patent: May 9, 2023

(54) VARIABLE OPTICAL ATTENUATOR ASSISTED CONTROL OF OPTICAL DEVICES

(71) Applicant: RANOVUS INC., Kanata (CA)

(72) Inventor: Bin Cao, Kanata (CA)

(73) Assignee: RANOVUS INC., Kanata (CA)

( * ) Notice: Subject to any disclaimer, the term of this patent is extended or adjusted under 35 U.S.C. 154(b) by 351 days.

(21) Appl. No.: 16/986,513

(22) Filed: Aug. 6, 2020

(65) Prior Publication Data
US 2022/0045469 A1     Feb. 10, 2022

(51) Int. Cl.
*H01S 3/00*     (2006.01)
*G02B 26/02*    (2006.01)
*H01S 3/063*    (2006.01)

(52) U.S. Cl.
CPC .............. *H01S 3/005* (2013.01); *G02B 26/02* (2013.01); *H01S 3/063* (2013.01)

(58) Field of Classification Search
CPC ........ H01S 3/005; H01S 3/063; H01S 5/0085; H01S 5/0687; G02B 26/02; B82Y 20/00; G02F 2201/17; G02F 2203/48; G02F 1/0147; G02F 1/011; G02F 1/0121
See application file for complete search history.

(56) References Cited

U.S. PATENT DOCUMENTS

| 7,760,422 | B2  | 7/2010  | Kuo et al. |
| 9,134,169 | B2* | 9/2015  | Li ........................ G01J 1/0209 |
| 9,784,995 | B2  | 10/2017 | Hauenschild et al. |
| 10,714,895 | B2 | 7/2020  | Krishnamoorthy et al. |
| 2005/0249509 | A1 | 11/2005 | Nagarajan et al. |
| 2008/0138088 | A1 | 6/2008 | Welch et al. |
| 2010/0284649 | A1* | 11/2010 | Ishii ...................... G02F 1/0147 385/31 |
| 2014/0321848 | A1 | 10/2014 | Sekiguchi |
| 2015/0316794 | A1 | 11/2015 | Hayakawa |
| 2015/0323743 | A1 | 11/2015 | Nicholson et al. |
| 2016/0218481 | A1 | 7/2016 | Akiyama |
| 2017/0139236 | A1* | 5/2017 | Cao .................... G02B 6/29338 |
| 2017/0229837 | A1 | 8/2017 | Cao et al. |
| 2019/0215089 | A1* | 7/2019 | Huang .................. H04B 10/40 |

FOREIGN PATENT DOCUMENTS

EP     3550680 A1     10/2019

* cited by examiner

*Primary Examiner* — Ellen E Kim
(74) *Attorney, Agent, or Firm* — Perry + Currier, Inc.

(57) ABSTRACT

Variable optical attenuator assisted control of optical devices is provided. A device comprises: an uncooled laser and ring resonator modulator, an optical waveguide configured convey an optical signal of the laser from an input to an output, a heater that heats the ring resonator modulator, a variable optical attenuator that attenuates the optical signal on the optical waveguide, one or more power monitors and a controller. The controller is configured to: in response to determining that one or more of: heater power overhead is unavailable to reduce heater power for laser wavelength tracking; and the heater power is at or below a given lower heater power; and determining that that laser current is increased to assist with ring resonator modulator control for the laser wavelength tracking: control, using the one or more power monitors, attenuation of the VOA to control the output power into a target output power range.

19 Claims, 7 Drawing Sheets

VARIABLE OPTICAL ATTENUATOR ASSISTED CONTROL OF OPTICAL DEVICES

BACKGROUND

For inside data center applications and other chip-to-chip communication applications, optical devices are generally uncooled. Such optical devices include photonics-based ring modulators and ring heaters; the ring heaters are controlled to control a modulation wavelength of the ring modulators to cause the ring modulators to track (e.g. modulate) a laser wavelength over temperature and life of the optical devices. As ring modulators are very thermally sensitive, they may require extremely high heater power to cover many possible conditions, which can lead to very high power requirements for such optical devices.

BRIEF DESCRIPTION OF THE DRAWINGS

For a better understanding of the various examples described herein and to show more clearly how they may be carried into effect, reference will now be made, by way of example only, to the accompanying drawings in which.

Figure 1:
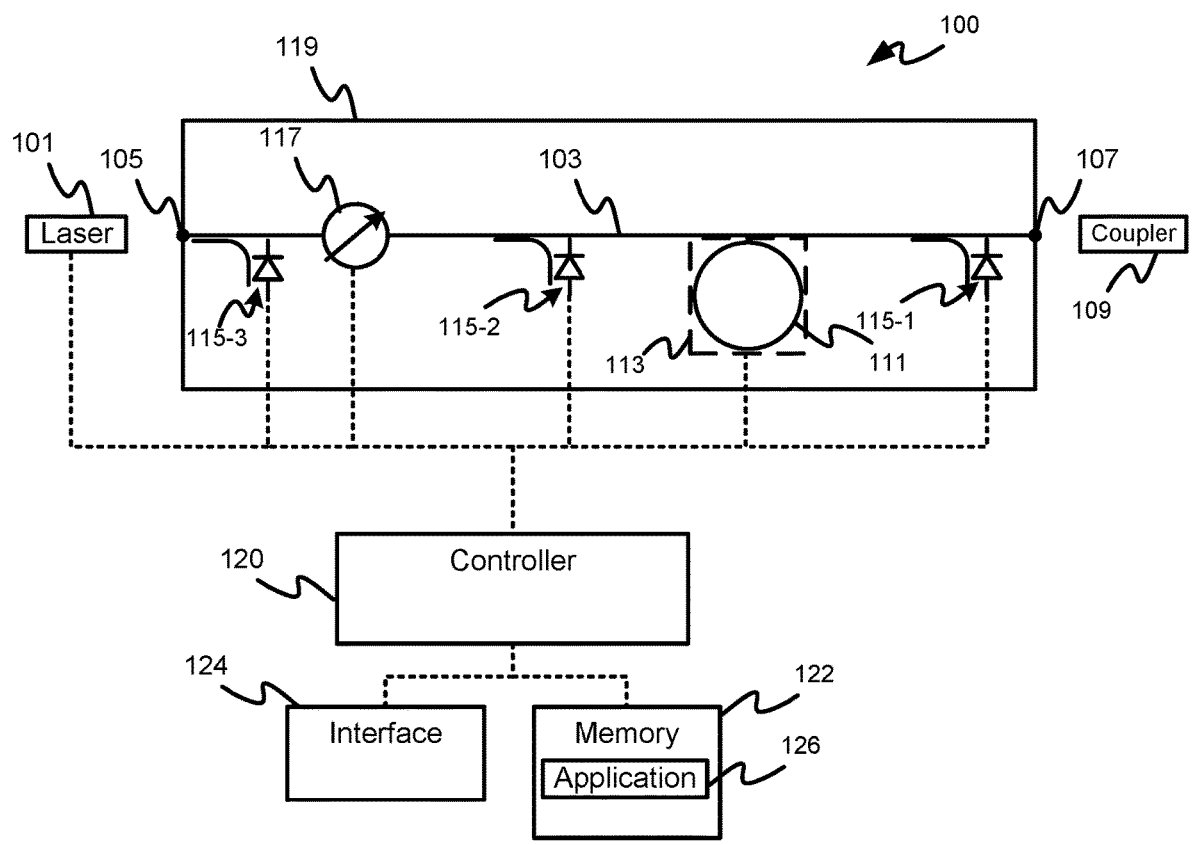
FIG. 1 depicts an example device with variable optical attenuator assisted control, in accordance with some examples.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

For inside data center applications, and other chip-to-chip communication applications, optical devices are generally uncooled. Such optical devices include photonics-based ring modulators and ring heaters; the ring heaters are controlled to control a modulation wavelength of the ring modulators to cause the ring modulators to track (e.g. modulate) a laser wavelength over temperature and life of the optical devices. As ring modulators are very thermally sensitive, they may require extremely high heater power to cover many possible conditions, which can lead to very high power requirements for such optical devices.

Hence, provided herein is a device which includes an uncooled laser, at least one uncooled ring resonator modulator where a modulating wavelength is controlled via a heater, and a variable optical attenuator which is used, in combination with controlling laser current of the laser, to control an output power of the device. In general, the device may be configured to operate within a specified target output power range (e.g. target output power range), as well as implement any suitable ring resonator modulator control to cause the ring resonator modulator to track a wavelength (and/or a frequency) of the laser (e.g. using insertion loss monitoring).

Such control and tracking may be performed using power monitors on an optical waveguide where the ring resonator modulator and variable optical attenuator are located, which may include, but is not limited to, optical taps in combination with photodiodes.

Two control loops may bence be implemented at a controller of the present device: a ring resonator modulator control loop (e.g. an insertion loss control loop) to control the ring modulator to track the wavelength (and/or frequency) of the laser and an output power control loop. In general, the ring resonator modulator control loop is implemented at a faster rate than the output power control loop.

The ring resonator modulator control loop may include, but is not limited to, controlling the heater power to track the wavelength of an optical signal output by the laser to maintain a given insertion loss, as well as increasing (or decreasing) the laser current to shift the wavelength of the laser. In a particular example, when the laser wavelength undergoes a blue shift, the heater power may be reduced to reduce the modulating wavelength of the ring resonator modulator and, when the laser wavelength undergoes a red shift, the heater power may be increased to increase the modulating wavelength of the ring resonator modulator. However, to decrease the heater power to be able to track all possible laser wavelengths of the laser (e.g. a laser wavelength may shift within about a 5 nm range), the heater power must have enough overhead such that, when the heater power is decreased to a lowest operational heater power (e.g. below which the heater power may not be adjusted, for example "0"), the modulating wavelength of the ring resonator modulator is about aligned with the lowest possible laser wavelength used in operation of the device. When there is not enough overhead (e.g. which may be determined by determining that the heater power is at or below a given low heater power), the laser current may be increased to red shift the laser wavelength to bring the laser wavelength back into a range where the heater may be controlled to control the modulating wavelength of the ring resonator modulator to about aligned with the laser wavelength. However, such increases in laser current may cause the output power of the device to exceed a target output power range.

Hence, the output power control loop is generally to control the output power, which includes controlling the variable optical attenuator to compensate for increases in output power that may occur due to increases in laser current, in the control of the ring resonator modulator when tracking the wavelength.

Compared to devices that are lacking a variable optical attenuator, presently provided devices may have lower overall operating power. For example, as already discussed, as the laser wavelength undergoes a blue shift (e.g. due to age, degradation, temperature changes and the like), one way to control the ring resonator modulator to track the laser wavelength is to reduce heater power to reduce a modulating wavelength of the ring resonator modulator and increase the laser current to compensate for there not being enough overhead on the heater power to fully track the laser wavelength. The output power is then reduced using the variable optical attenuator.

However, with devices that lack a variable optical attenuator, the heater is generally operated at a higher heater power and hence a higher heater power overhead, to provide the ring resonator modulator with a greater wavelength range over which it may be adjusted, to enable the ring resonator modular to better track the laser wavelength without increasing the laser current and hence the output power. However, this generally increases the overall power used by such devices, as compared to devices with a variable optical attenuator, as described herein.

An aspect of the specification provides a device comprising: a laser configured to produce an optical signal; an optical waveguide configured to: receive the optical signal at an input; and convey the optical signal to an output; a ring resonator modulator configured to modulate the optical signal on the optical waveguide, wherein the laser and the ring resonator modulator are uncooled; a heater configured to heat the ring resonator modulator; a variable optical attenuator (VOA) configured to attenuate the optical signal on the optical waveguide; one or more power monitors configured to monitor: modulation of the optical signal on the optical waveguide; and output power of the optical signal; and a controller configured to: in response to: determining that one or more of: heater power overhead is unavailable to reduce heater power for laser wavelength tracking; and the heater power is at or below a given lower heater power; and determining that laser current is increased to assist with ring resonator modulator control for the laser wavelength tracking: control, using the one or more power monitors, attenuation of the VOA to control the output power into a target output power range.

An aspect of the specification provides a method comprising: in response to: determining, at a controller of a device, that one or more of: heater power overhead is unavailable to reduce heater power for laser wavelength tracking; and the heater power is at or below a given lower heater power; and determining that laser current is increased to assist with ring resonator modulator control for the laser wavelength tracking: controlling, using one or more power monitors of the device configured to monitor output power, attenuation of a variable optical attenuator (VOA) to control the output power into a target output power range, the device comprising: a laser configured to produce an optical signal; an optical waveguide configured to: receive the optical signal at an input; and convey the optical signal to an output; a ring resonator modulator configured to modulate the optical signal on the optical waveguide, wherein the laser and the ring resonator modulator are uncooled; a heater configured to heat the ring resonator modulator; the configured to attenuate the optical signal on the optical waveguide; one or more power monitors configured to monitor: modulation of the optical signal on the optical waveguide; and the output power of the optical signal; and the controller.

FIG. 1 depicts a device 100 with variable optical attenuator assisted control as described hereafter, which may generally be used for inside data center applications (and/or other chip-to-chip communication applications), for example to optically communicate data within data centers (and/or between data centers). The device 100 comprises a laser 101 configured to produce an optical signal (e.g. laser light). The laser 101 may comprise a distributed feedback laser (DFB) laser, a single mode laser and the like, and/or any other suitable type of laser compatible with optical data communication. In general, the laser 101 outputs an optical signal at a wavelength, referred to hereafter as a laser wavelength and/or an input wavelength (and/or input frequency) to the device 100. It is understood that the laser wavelength of a DFB laser may drift over time, due to age, degradation, temperature, and the like, for example over a range of about 5 nm, though other ranges are within the scope of the present specification.

The device 100 further comprises an optical waveguide 103 configured to: receive the optical signal at an input 105 (e.g. a facet, a coupler, and the like); and convey the optical signal to an output 107 (e.g. to a coupler 109 which may include, but is not limited to, a single mode fiber coupler which couples the device 100 to a single mode optical fiber, and the like). The optical waveguide 103 generally comprises an optical bus, and the like.

The device 100 further comprises a ring resonator modulator 111 configured to modulate the optical signal on the optical waveguide 103. An optical transfer function of the ring resonator modulator 111 is described below with respect to FIG. 2 but generally consists of a series of resonance peaks as a function of wavelength or frequency, and when the ring resonator modulator 111 is controlled to operate in a region of one of the resonance peaks, the ring resonator modulator 111 "taps" the optical signal on the optical waveguide 103, to draw some of laser light into the ring resonator modulator 111.

Furthermore, while not depicted for simplicity, the ring resonator modulator 111 is generally understood to include a voltage control device which may be used to control a voltage across at least a portion of the ring resonator modulator 111, which shifts a modulating wavelength (e.g. and/or a resonance frequency and/or the resonance peaks of the optical transfer function) of the ring resonator modulator 111. By controlling the voltage across the ring resonator modulator 111 to shift and unshift the modulating wavelength and/or the resonance frequency, the optical signal on the optical waveguide 103 is modulated and hence data may be encoded into the optical signal. Such control is described below with respect to FIG. 3.

Hence, the ring resonator modulator 111 is generally controlled to about align a modulating wavelength (e.g. a region of a resonance peak of the optical transfer function) with the laser wavelength of the optical signal output by the laser 101. In particular, modulating wavelength and/or a resonance frequency of the ring resonator modulator 111 is sensitive to heat. Hence, to control the modulating wavelength and/or a resonance frequency of the ring resonator modulator 111, the device 100 further comprises a heater 113 configured to heat the ring resonator modulator 111. In general, the heater 113 is controlled to align a region of one of the resonance peaks of the optical transfer function with the laser wavelength.

The heater 113 is drawn in outline to indicate that the heater 113 may be "under" or "over" and/or parallel to the ring resonator modulator 111 (e.g. but in a different plane from the ring resonator modulator 111).

Furthermore, as will be described below with respect to FIG. 2 and FIG. 3, the ring resonator modulator 111 will generally modulate different wavelengths and/or a resonate at different resonance frequencies that correspond to integer multiples of a frequency at which the ring resonator modulator 111 resonates (e.g. which correspond to positions of the resonance peaks); a given resonance frequency at which the ring resonator modulator 111 is operating is controlled by the heater 113 in which, generally, higher heater powers result in lower resonance frequencies and/or higher modulating wavelengths. It is understood that while hereafter, the ring resonator modulator 111 will be described with respect to control of a modulating wavelength, such control generally occurs by controlling the resonance frequency of the ring resonator modulator 111.

Hence, the heater 113 may be used to control the ring resonator modulator 111 to a temperature at which the ring resonator modulator 111 modulates wavelengths that are about the same as the laser wavelength of the optical signal output by the laser 101. The voltage control device may then be used to modulate and/or change the modulating wavelength to modulate the optical signal on the optical waveguide 103. Furthermore, as will be described in more detail below, the heater power of the heater 113 can be adjusted to increase or decrease the modulating wavelength of the ring resonator modulator 111 to track the laser wavelength as the laser 101 and/or the ring resonator modulator 111 ages, degrades, and/or changes temperature, and the like, over time.

To monitor wavelength tracking of the ring resonator modulator 111, and to monitor output power, the device 100 further comprises one or more power monitors 115-1, 115-2, 115-3 which, as depicted comprise a respective optical tap on the optical waveguide 103 and a respective photodiode. The optical taps may include, but are not limited to, fiber taps, and the like, that divert a fraction of the optical signal from the optical waveguide 103 to a respective photodiode arranged so that tapped optical signals (e.g. light) from a fiber tap illuminate the photodiode and produce an electrical signal. In general, wavelength tracking of the ring resonator modulator 111 may be monitored by monitoring insertion loss, for example by monitoring a ratio of a modulated optical signal to an unmodulated optical signal on the optical waveguide 103 and/or ratio of an output from the ring resonator modulator 111 to an input to the ring resonator modulator 111 and/or a ratio of an output from the power monitor 115-1 to an output from the power monitors 115-2, as described hereafter.

However, it is understood that insertion loss monitoring is one example of monitoring wavelength tracking of a ring resonator modulator, and any suitable process for monitoring wavelength tracking of a ring resonator modulator is within the scope of the present specification. Hence, while hereafter ring resonator modulator control for laser wavelength tracking is described with respect to insertion loss monitoring and/or control, it is understood that resonator modulator control for laser wavelength tracking may occur using any suitable process.

The power monitors 115-1, 115-2, 115-3 are interchangeably referred to hereafter, collectively, as the power monitors 115 and, generically, as a power monitor 115.

In general, the power monitors 115 are configured to monitor: modulation of the optical signal on the optical waveguide 103 (e.g. via monitoring insertion loss on the optical waveguide 103 due to the ring resonator modulator 111, and/or any other suitable process); and output power of the optical signal on the optical waveguide 103 (e.g. at the output 107). Hereafter, references to "output power" of the device 100, and the like, is understood to refer to optical output power and/or power of an optical signal output by the device 100, and the like, at the output 107, and the like. Such output power is in contrast to power usage by the device 100, and the like, to control optical components of the device 100 such as the power used by the laser 101, the heater 113, a voltage control device, etc.

As depicted, the power monitor 115-1 is located between the ring resonator modulator 111 and the output 107, and the power monitor 115-2 is located between input 105 and the ring resonator modulator 111. Hence, the power monitor 115-1 may be used to measure both power of modulated and unmodulated optical signals on the optical waveguide 103 as the ring resonator modulator 111 modulates the optical signal, and the power monitor 115-2 may be used to measure power of optical signals on the optical waveguide 103 prior to being modulated by the ring resonator modulator 111. As such, the ratio of respective output of the power monitors 115-1, 115-2 may be used to determine insertion loss on the optical waveguide 103 due to changes in modulating wavelength and/or resonance frequency of the ring resonator modulator 111. However, the power monitor 115-1 may also be used to measure power output by the device 100 at the output 107.

As depicted, the device 100 includes the power monitor 115-3 which is located at the input 105 and may be used to measure power of the optical signal as input into the optical waveguide 103 by the laser 101; however, the power monitor 115-3 may be optional.

As depicted, the device 100 further comprises a variable optical attenuator (VOA) 117 configured to attenuate the optical signal on the optical waveguide 103. For example, the VOA 117 may comprise uses a diode, and the like, on the optical waveguide 103 which may change a waveguide property of the optical waveguide 103 to attenuate optical signals on the optical waveguide 103. The attenuation of the VOA 117 is understood to be variable; for example, a voltage of a diode thereof may be controlled to change the attenuation.

For example, the VOA 117 may be operated at greater than, or equal to, given low VOA attenuation comprising a lowest attenuation at which the VOA 117 is selected to be operationally controlled. In general, the given low VOA attenuation may be "zero" and/or "0", however the given low VOA attenuation may be greater than zero and may generally depend on physical characteristics of the VOA 117 and/or a preselected operational value. Hence, the attenuation of the VOA 117 may be at, or greater than, the given low VOA attenuation; however, when the given low VOA attenuation is greater than zero, the attenuation of the VOA 117 may be less than the given low VOA attenuation. The attenuation of the VOA 117 is not, however, generally negative.

As depicted, the VOA 117 is located between the input 105 (and/or the power monitor 115-3) and the ring resonator modulator 111, with the power monitor 115-2 located between the VOA 117 and the ring resonator modulator 111. However, in other examples, the VOA 117 and the power monitors 115 may be located in other positions on the optical waveguide 103 as described in more detail below with respect to FIG. 5. However, in the configuration of FIG. 1, the attenuation of the VOA 117 may be determined by comparing a ratio of respective output of the power monitors 115-2, 115-3, though the output of the power monitor 115-1 generally is most indicative of output power of the optical signal at the output 107.

In general, the optical components of the device 100 including, but not limited to, the optical waveguide 103, the ring resonator modulator 111, the power monitors 115 and the variable optical attenuator 117 may be formed into a photonic integrated circuit PIC structure 119 of the device 100.

Furthermore, the device 100 further comprises a controller 120 which controls components of the device 100. For example, as depicted, the controller 120 is in communication with the laser 101, the heater 113, the power monitors 115 and the VOA 117. Indeed, for clarity, in FIG. 1 and throughout the present specification, solid lines connecting components depict optical connections that include flow of optical signals there between, while broken lines connecting components depict links that include flow of electrical data and/or electrical signals there between.

The controller 120 can comprise a processor and/or a plurality of processors, including but not limited to one or more central processors (CPUs) and/or one or more processing units; either way, the controller 120 comprises a hardware element and/or a hardware processor. Indeed, in some implementations, the controller 120 can comprise an ASIC (application-specific integrated circuit) and/or an FPGA (field-programmable gate array) specifically configured to implement the functionality of the controller 120. Hence, the controller 120 is not necessarily a generic computing device and/or a generic processor and/or a generic component of computing controller 120, but a device and/or an engine specifically configured to implement functionality as described herein including, but not limited to the blocks of a method depicted in FIG. 4.

While not depicted, the controller 120 may comprise a proportional-integral-derivative (PID) controller for controlling the heater 113. While not depicted, the controller 120 may further include an analog to digital converter (ADC) which converts signals from the photodiodes of the power monitors 115 to values on a scale of 0 to 255 (e.g. for 8 bits of ADC resolution), and the like, though any suitable scale and/or ADC resolution is within the scope of the present specification (including ADC resolutions which are higher or lower than 8 bits). While not depicted, the controller 120 may further include a voltage control device driver for controlling the voltage control device of the ring resonator modulator 111.

As depicted, the device 100 further comprises a memory 122 and an interface 124 each interconnected with the controller 120. The memory 122 can comprise a non-volatile storage unit (e.g. Erasable Electronic Programmable Read Only Memory ("EEPROM"), Flash Memory) and a volatile storage unit (e.g. random access memory ("RAM")). Programming instructions, such as an application 126, that implement the functional teachings of the controller 120 and/or the device 100 as described herein are typically maintained, persistently, in the memory 122 and used by the controller 120 which makes appropriate utilization of volatile storage during the execution of such programming instructions. Those skilled in the art recognize that the memory 122 is an example of computer readable media that can store programming instructions executable on the controller 120. Furthermore, the memory 122 is also an example of a memory unit and/or memory module and/or a non-volatile memory.

The interface 124 can comprise any wired and/or wireless interface configured to receive data used to modulate optical signals. As such, interface 124 is configured to correspond with communication architecture that is used to implement one or more communication links used to receive data, including but not limited to any suitable combination of, cables, serial cables, USB (universal serial bus) cables, and wireless links (including, but not limited to, WLAN (wireless local area network) links, WiFi links, WiMax links, cell-phone links, Bluetooth™ links, NFC (near field communication) links, packet based links, the Internet, analog networks, access points, and the like, and/or a combination). However, interface 124 is generally non-limiting and any interface used in optical telecommunication devices and/or optical telecommunication transmitters is within the scope of present implementations. Hence, for example, the interface 124 may receive data which may be processed by the controller 120 to control the voltage control device of the ring resonator modulator 111 to modulate optical signals as previously described.

In general, the controller 120 is configured to (e.g. upon execution of the application 126) to: in response to: determining one or more of: that heater power overhead of the heater 113 is unavailable to reduce heater power for laser wavelength tracking; and that heater power is at or less than a given low heater power (e.g. associated with a lowest operational heater power); and determining that laser current is increased to assist with ring resonator modulator control for the laser wavelength tracking: control, using the one or more power monitors 115, attenuation of the VOA 117 to control the output power into a target output power range.

In particular, the controller 120 may initially select a heater power at which to operate the heater 113 to select a resonance peak of the optical transfer function of the ring resonator modulator 111 that minimizes heater power overhead. From this, the heater power overhead may be determined (e.g. difference between a current heater power and a lowest operational heater power). As such, heater power may be controlled to control shift the modulating wavelength only as low as the lowest operational heater power (such as zero), as defined by the heater power overhead. Hence, the heater power overhead may be understood to include a maximum amount by which the heater power may be reduced to control the modulating wavelength of the ring resonator modulator 111 to track and/or follow the laser wavelength as the laser wavelength undergoes a blue shift. For example, a wavelength range over which the ring resonator modulator 111 may modulate a laser wavelength may be referred to as a modulating wavelength range with a lowest modulating wavelength in the modulating wavelength range being defined by the heater power being at the lowest operational heater power (such as zero).

As such, when the laser wavelength drifts below the modulating wavelength range of the ring resonator modulator 111 (e.g. such that when the heater power is reduced to a the lowest operational heater power and/or the heater power is at, or below, a given low heater power, which, for example, may comprise the lowest operational heater power (e.g. "0") or a small buffer heater power selected to prevent the heater power from reaching the lowest operation limit), the ring resonator modulator 111 can no longer modulate the laser wavelength, and the controller 120 may increase the laser current to increase the laser wavelength back into the modulating wavelength range of the ring resonator modulator 111, which leads to an increase in output power of the device 100, which may be decreased via the VOA 117. Control of the laser current to increase the laser wavelength back into the modulating wavelength range of the ring resonator modulator 111 generally occurs in the ring resonator modulator control loop (e.g. an insertion loss control loop). It is understood that the given low heater power is generally associated with a lowest operational heater power and/or represents the lowest operational heater power, and or comprises a selected lowest operational heater power, and the like.

Hence, both a ring resonator modulator control loop (e.g. an insertion loss control loop) and output power control loop are implemented in tandem at the device 100 to control both laser wavelength tracking of the ring resonator modulator 111, and output power. In general, the ring resonator modulator control loop is implemented at a faster rate than the output power control loop, however, as will be described in more detail below.

For example, as will be described in more detail below, the controller 120 may be configured to implement ring resonator modulator control loop as an insertion control loop to control insertion loss to be within a target insertion loss range; drift of insertion loss out of the target insertion loss range may occur for example, due to drift in the output of the laser 101, and/or drift in the ring resonator modulator 111, due to temperature, time, aging, and the like, as determined by comparing the output from the power monitors 115-1, 115-2.

For example, the controller 120 may control the laser current of the laser 101 and/or heater power of the heater 113 to maintain the insertion loss within the target insertion loss range. However, such control may cause the output power to be outside the target output power range, as monitored by the power monitor 115-1; as such, the controller 120 may implement a output power control loop to control the laser current of the laser 101 and/or attenuation of the VOA 117 to maintain the output power within the target output power range, which could again affect the insertion loss, which continues to be controlled by the controller 120 via control of the laser current of the laser 101 and/or heater power of the heater 113. However, in particular, the output power control loop is implemented in a manner that attempts to minimize heater power in the insertion loss control loop (and/or any suitable ring resonator modulator control for laser wavelength tracking), as described in more detail with respect to FIG. 4.

Figure 2A:
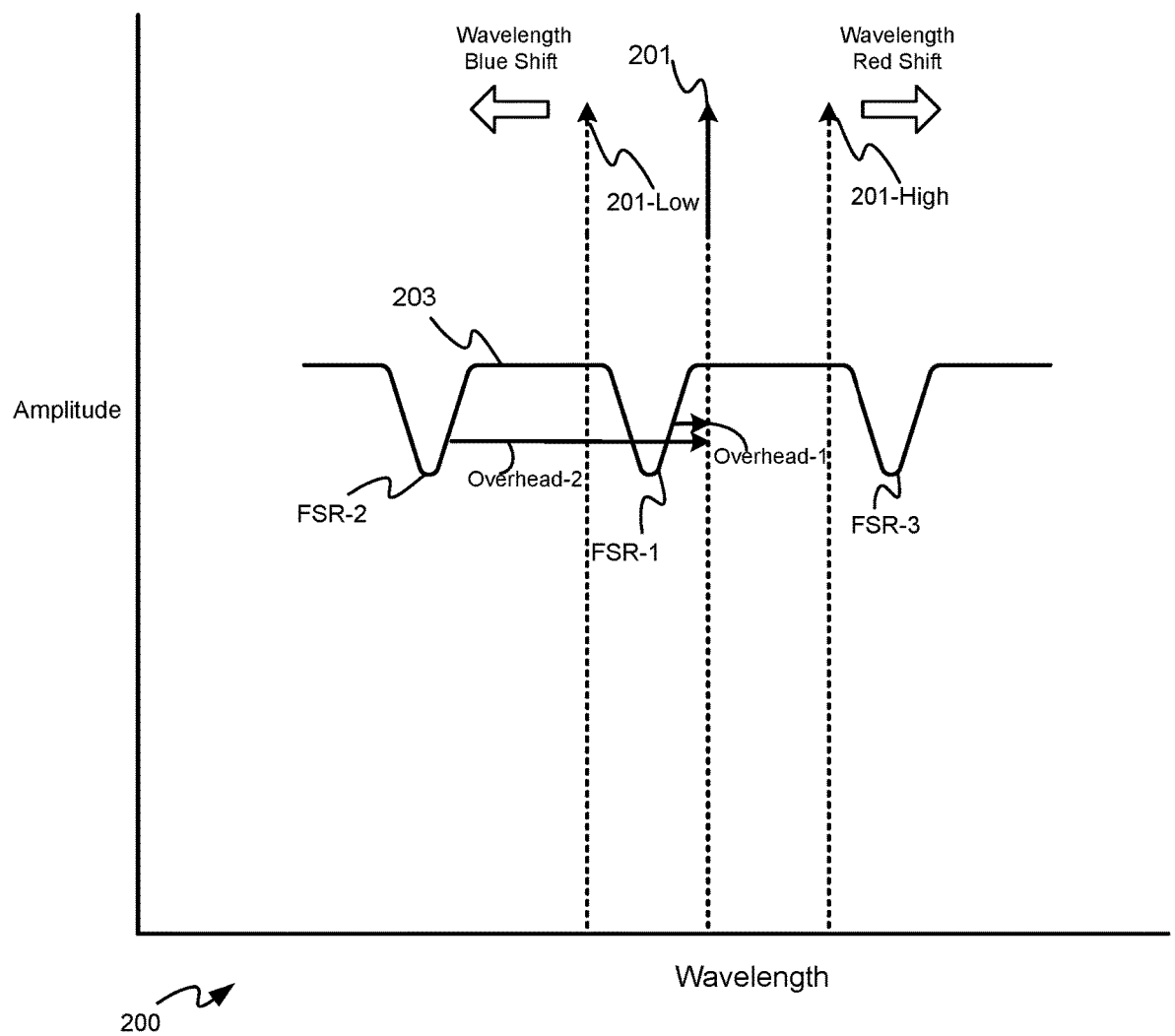
FIG. 2A depicts example input wavelengths of a laser, and an optical transfer function of a ring resonator modulator of the device of FIG. 1, in accordance with some examples.
Figure 2B:
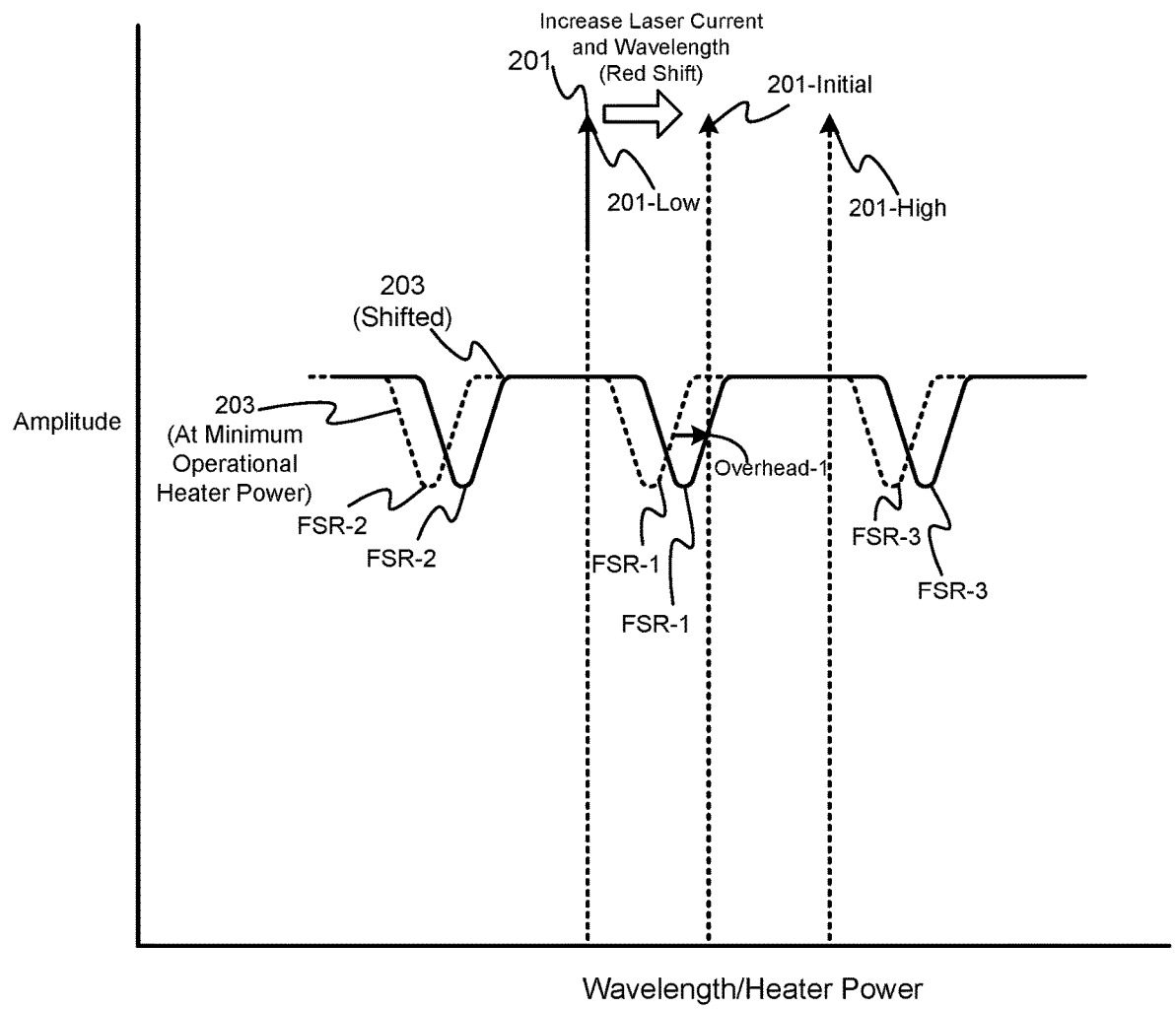
FIG. 2B depicts example control of the optical transfer function using a heater as the input wavelength of the laser drifts, in accordance with some examples.
Figure 3:
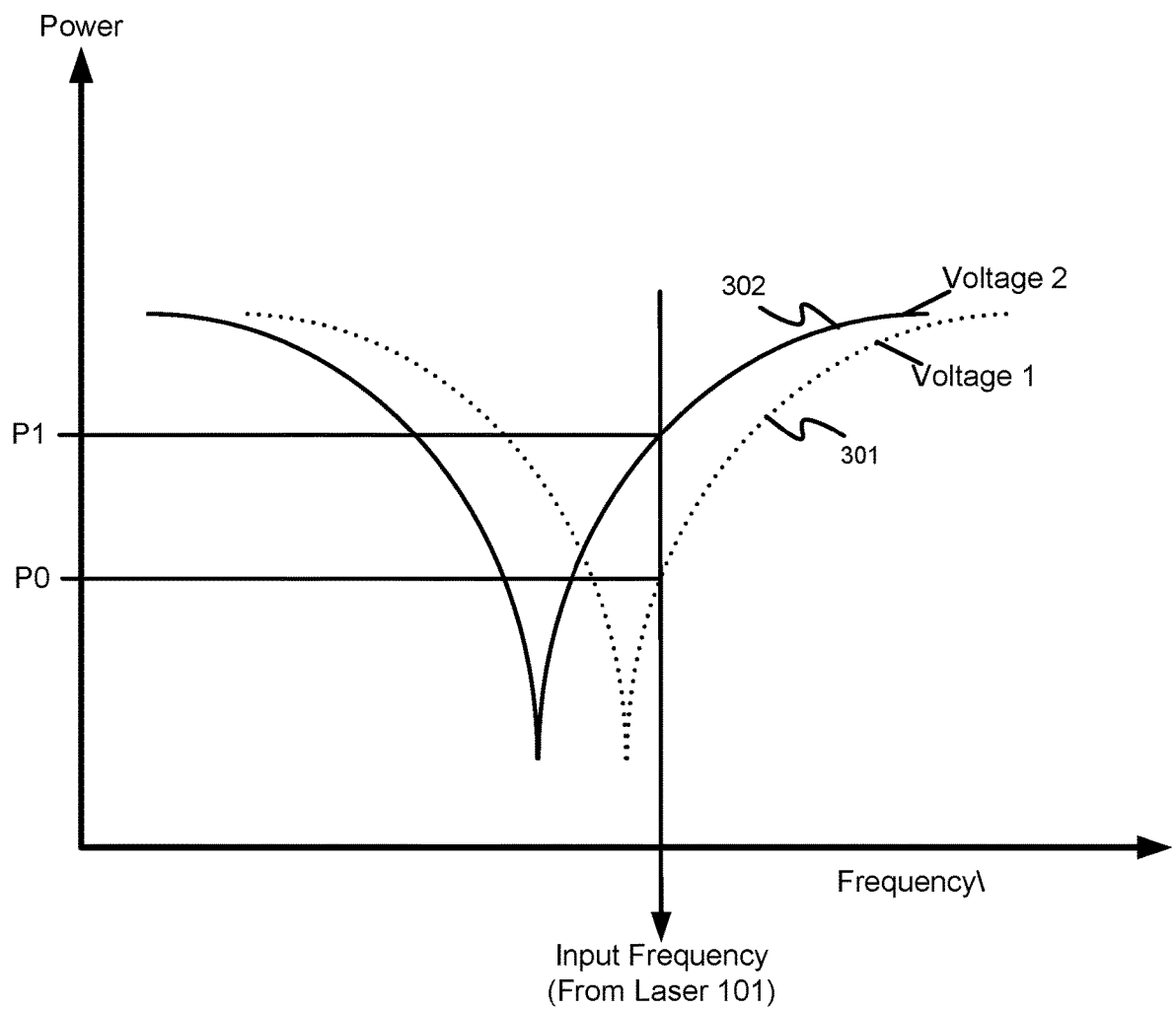
FIG. 3 depicts an example magnitude profiles of the ring resonator modulator of the device of FIG. 1, in accordance with some examples.

Operation of the ring resonator modulator 111 is now briefly described with respect to FIG. 2 and FIG. 3.

Attention is next directed to FIG. 2, which depicts a graph 200 showing both a laser wavelength 201 of an optical signal of the laser 101 at a given initial laser current at a specific temperature condition (e.g. selected to provide a given optical power output and/or based on any other suitable factors), with an optical transfer function 203 of the ring resonator modulator 111, as a function of amplitude vs. wavelength. As previously described, the optical transfer function 203 include various resonance peaks labelled FSR-1, FSR-2, FSR-2 and which are understood to be separated by a Free Spectral Range (FSR) wavelength of the ring resonator modulator 111. Each of the resonance peaks FSR-1, FSR-2, FSR-3 represent different resonance frequencies at which the ring resonator modulator 111 may resonate at different temperatures. The position of the optical transfer function 203 may change as the heater power is increased (e.g. hence increasing a temperature of the ring resonator modulator 111); however, as depicted position of the optical transfer function 203 with respect to the laser wavelength 201 may be when the heater power is at an operational minimum, such as zero, and the like.

It is apparent from FIG. 2 that under the depicted conditions, none of resonance peaks FSR-1, FSR-2, FSR-3 align with the laser wavelength 201. It is further understood that the positions of the resonance peaks FSR-1, FSR-2, FSR-3 may be red-shifted as the heater power increases. Hence, for example, to align a "red" shoulder (e.g. a right hand slope) of the resonance peak FSR-1 the heater power may be increased to shift the resonance peak FSR-1 by an amount Overhead-1; similarly, to align a "red" shoulder (e.g. a right hand slope) of the resonance peak FSR-2 the heater power may be increased to shift the resonance peak FSR-2 by an amount Overhead-2. While the amounts Overhead-1, Overhead-2 are defined with respect to wavelength shifts, the amounts Overhead-1, Overhead-2 are further understood to correspond to heater power overheads (e.g. an amount by which the heater power may be reduced to move the resonance peaks FSR-1, FSR-2 back into the positions depicted in FIG. 2).

It is further understood that when the heater power is increased to shift the resonance peak FSR-1 by an amount Overhead-1, the remaining resonance peaks FSR-2, FSR-3 are shifted by a same amount, and similarly, when the heater power is increased to shift the resonance peak FSR-2 by an amount Overhead-2, the remaining resonance peaks FSR-1, FSR-3 are shifted by a same amount.

Hence, as depicted either of the resonance peaks FSR-1, FSR-2 may be shifted and used to modulate the laser wavelength 201. However, as the resonance peak FSR-3 is at wavelengths that are higher than the laser wavelength 201, and as the ring resonator modulator 111 is not cooled, the resonance peak FSR-3 may not be used to modulate the laser wavelength 201 (e.g. as the ring resonator modulator 111 would need to be cooled to below the depicted operational heater power minimum to blue shift the resonance peak FSR-3 until aligned with the laser wavelength 201).

Also depicted in FIG. 2 is a wavelength 201-Low and a wavelength 201-High respectively representing lowest and highest wavelengths of a range over which the laser wavelength 201 may drift during operation. As previously mentioned, the wavelength range of the laser 101 may vary in a range of about 5 nm. Hence, the wavelength 201-Low and the wavelength 201-High may be separated by about 5 nm with the laser wavelength 201 being between the wavelength 201-Low and the wavelength 201-High. The laser wavelength 201 may hence drift towards the wavelength 201-Low in a blue shift (e.g. to a shorter wavelength) or may drift towards the wavelength 201-High in a red shift (e.g. to a longer wavelength).

As is further apparent from FIG. 2, wavelengths of the resonance peak FSR-1 are all greater than the wavelength 201-Low, but are less than the wavelength 201-High.

As such, when the laser wavelength 201 drifts towards the wavelength 201-High, the heater power may be increased to cause the resonance peak FSR-1 to "follow" the laser wavelength 201 as it drifts towards the wavelength 201-High. For example, when the resonance peak FSR-1 of the optical transfer function 203 is used to modulate the optical signal represented by the laser wavelength 201, heater power may be used to cause the resonance peak FSR-1 to "follow" and/or "track" the laser wavelength 201 as it drifts towards the wavelength 201-High. Such following may occur via monitoring insertion loss, as described above.

However, as the ring resonator modulator 111 is not cooled, and as the depicted position of the resonance peak FSR-1 represents the lowest possible position when the heater power is at an operational minimum, when the laser wavelength 201 drifts towards the wavelength 201-Low, the heater power may be reduced only to bring the position of the resonance peak FSR-1 to the lowest possible position shown in FIG. 2A. As such, when the resonance peak FSR-1 of the optical transfer function 203 is used to modulate the optical signal represented by the laser wavelength 201, heater power may not be used to cause the resonance peak FSR-1 to "follow" and/or "track" the laser wavelength 201 as it drifts towards the wavelength 201-Low. However, the laser current may be increased to induce a red shift in the laser wavelength 201.

For example, attention is directed to FIG. 2B which is substantially similar to FIG. 2A with like components having like numbers. However, in FIG. 2B, the optical transfer function 203 is depicted both in outline, at the minimum operational heater power position of FIG. 2A, and, in solid lines, at a position shifted by the amount Overhead-1 (e.g. the heater power has been increased to shift the resonance peak FSR-1 to modulate the laser wavelength 201 at the position indicated in FIG. 2B). However, in FIG. 2B, the laser wavelength 201 has drifted to the wavelength 201-Low which is lower than the resonance peak FSR-1 at either position of the optical transfer function 203.

However, the laser current of the laser 101 may be increased to cause the laser wavelength 201 to increase (e.g. undergo a red shift) such that the laser wavelength 201 is back to a value where the laser wavelength 201 may be modulated by the resonance peak FSR-1. Such an increase in laser current may cause the output power of the device 100 to increase out of a target output power range, however the output power of the device 100 may be decreased back into the target output power range may increasing attenuation of the VOA 117. Hence, with the VOA 117, the laser current may be used in ring resonator modulator control for laser wavelength tracking to increase the laser wavelength 201 to better align the laser wavelength 201 with the resonance peak FSR-1 of the optical transfer function 203.

However, without the VOA 117, in order to provide more heater power overhead, the heater power would be controlled to use the resonance peak FSR-2 to modulate and "track" the laser wavelength 201 (e.g. such that the heater power could be increased or decreased to cause the resonance peak FSR-2 to "track" the laser wavelength 201 between the wavelength 201-Low and the wavelength 201-High (e.g. as in its lowest position, wavelengths of the resonance peak FSR-2 are lower than the wavelength 201-Low). However, such an increased heater power overhead results in higher overall power being used at the device 100 as compared to when the VOA 117 is used to control output power, though output power may still be controlled using laser current.

Attention is next directed to FIG. 3 which depicts schematic transmission magnitude profiles 301, 302 of the ring resonator modulator 111 as a function of frequency for two different applied voltages, as applied by the voltage control device of the ring resonator modulator 111, as controlled by a voltage control device driver of the controller 120 (e.g. a module of the controller for driving the voltage control device). A baseline position of transmission magnitude profiles 301, 302 may be determined by the heater power of the heater 113. For example, at a given heater power and a first given applied voltage "Voltage 1" (via the voltage control device), optical transmission on the optical waveguide 103 may occur according to the transmission magnitude profiles 301, and be modulated to the transmission magnitude profile 302 via the voltage control device being controlled to a second given applied voltage "Voltage 2". As such the transmission magnitude profiles 301, 302 corresponds to one of the resonance peaks FSR-1, FSR-2 of FIG. 2, but shown in units of frequency rather than wavelength.

While only two applied voltages are depicted, and hence two transmission magnitude profiles 301, 303, in other examples more than two applied voltages may be used. For example, as depicted, two applied voltages may be used in an NRZ (non-return to zero) data format, four applied voltages may be used in a pulse amplitude modulation 4 (PAM-4) data format, and eight applied voltages may be used in a PAM-8 data format. However, any suitable number of applied voltages may be used in any suitable format.

Also depicted is a line corresponding to an input frequency from the laser 101 that is being modulated by the ring resonator modulator 111. The input frequency corresponds to the laser wavelength 201 of FIG. 2. While the input frequency is shown at a blue shoulder of the transmission magnitude profiles 301, 302, the input frequency may be at a red shoulder of the transmission magnitude profiles 301, 302 (e.g. similar to as depicted in FIG. 2A and/or FIG. 2B).

For example, for each of a Voltage 1 (profile 301) and a Voltage 2 (profile 302, and Voltage 2 being different from Voltage 1), in each of the profiles 301, 302, a resonance frequency of the ring resonator modulator 111 corresponds to a minimum of the corresponding transmission magnitude profile 301, 302; the minimum for each profile 301, 302 can hence also be referred to as reference frequency. In other words, the transmission magnitude profile (and the resonance frequency) shifts as a function of voltage.

Hence, the ring resonator modulator 111 is used to modulate the optical signal being conveyed through the optical waveguide 103. Furthermore, as has already been described, insertion loss can be determined from an input to the ring resonator modulator 111 as compared to an output from the ring resonator modulator 111. For example, as data rates tend to be very high in optical communication systems for example on the order of 28 Gb/s, and a response of photodiodes is slower than such a data rate, the photodiode the power monitor 115-1 will generally measure an average of power output from the ring resonator modulator 111 at two applied voltage levels, P0 and P1 (e.g. P0 corresponding to a "0" generally corresponding to a "0" in a binary data stream generated by modulating the optical signal on the optical waveguide 103, and P1 generally corresponding to a "1" in the binary data stream). However, the power monitor 115-1 will generally measure the average of power output from the ring resonator modulator 111 at any given number of applied voltage levels.

Hence, laser wavelength tracking of the ring resonator modulator 111 may be monitored by monitoring insertion loss, and in particular a ratio of: the average power measured by the power monitor 115-1 (which corresponds to as depicted in FIG. 3); and the average power measured by the power monitor 115-2.

Furthermore, laser wavelength tracking of the ring resonator modulator 111 and/or the insertion loss may be controlled by shifting the transmission magnitude profiles 301, 302 (e.g. shifting the corresponding resonance peak FSR-1 or FSR-2) of the ring resonator modulator 111 via the controller 120 controlling the heater power of the heater 113 and/or by shifting the input frequency via the controller 120 controlling the laser current of the laser 101.

Regardless, in the device 100, insertion loss is determined from output from the power monitors 115-1, 115-2, and the controller 120 generally controls the heater 113 to change the insertion loss into a target insertion loss range, for example as stored at the memory 122 and/or at the application 126.

As will next be described, an insertion loss control loop, and/or any suitable ring resonator modulator control for laser wavelength tracking, may be implemented by the controller 120 in conjunction with controlling the output power of the device 100 via controlling the laser current of the laser 101 and/or an attenuation of the VOA 117.

For example, other optical devices, to which the device 100 is conveying a modulated optical signal, may require that input power be within a given range, and hence a target output power range may be predetermined, for example according to prespecified operating parameters of a communication system of which the device 100 is a component.

As such, the controller 120 may generally be configured to control the output power of the device 100 to be within a target output power range, which may be stored at the memory 122 and/or at the application 126. Such control is next described.

As will be described below, the controller 120 may be configured to control one or more of the attenuation of the VOA 117 and the laser current of the laser 101 based on one or more of: the output power being greater or less than the target output power range; the heater power being greater than a given lower heater power; the heater power overhead being available or unavailable (e.g. to reduce heater power for laser wavelength tracking); an insertion loss on the optical waveguide being within a target insertion loss range (or outside the target insertion loss range); and the attenuation of the VOA 117 being greater than the given low VOA attenuation. The given low VOA attenuation, as described above, may be predetermined and stored at the memory 122 and/or the application 126.

Figure 4:
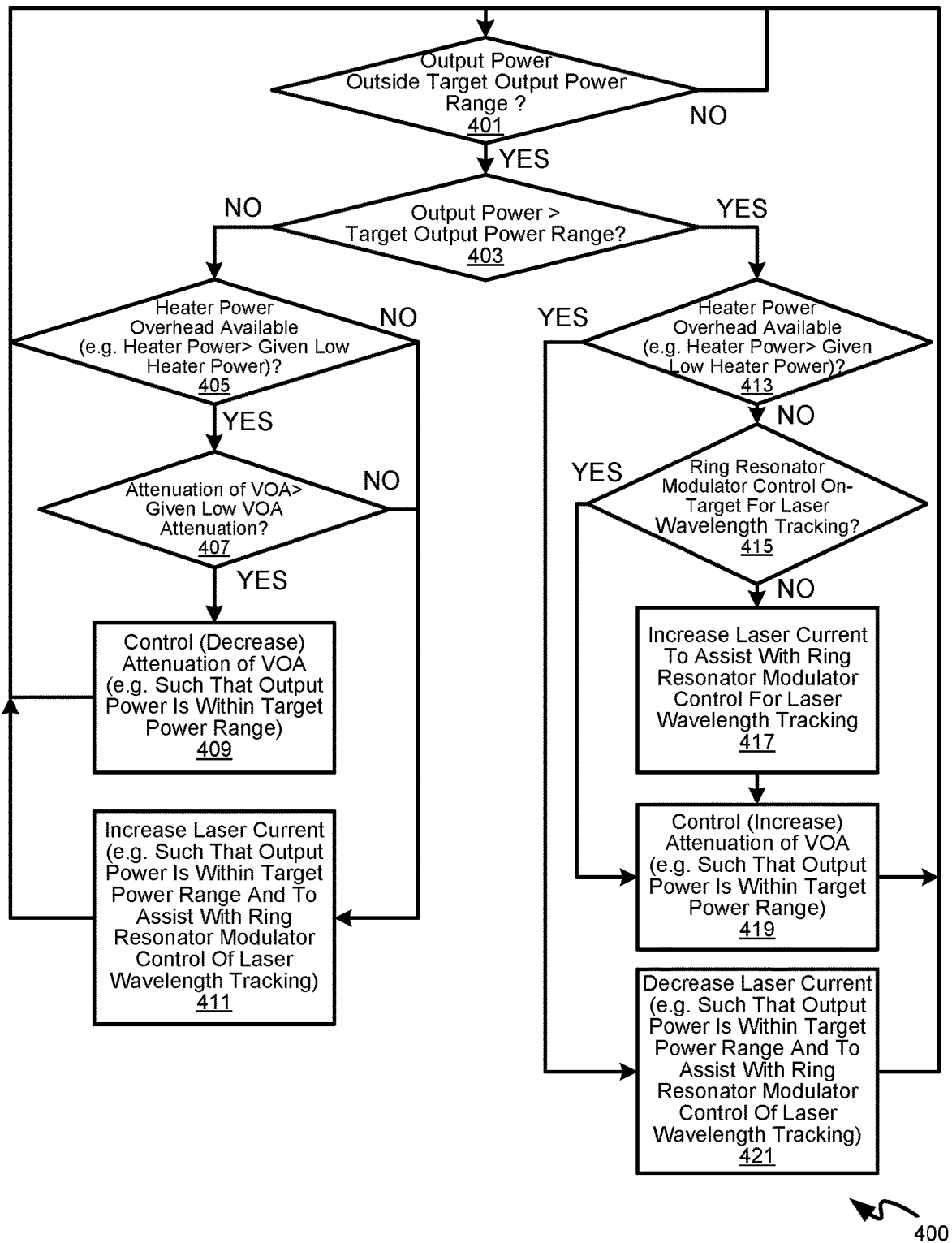
FIG. 4 depicts a method for variable optical attenuator assisted control of optical devices, in accordance with some examples.

Attention is now directed to FIG. 4 which depicts a flowchart representative of a method 400 for variable optical attenuator assisted control of optical devices. The operations of the method 400 of FIG. 4 correspond to machine readable instructions that are executed by the device 100, and specifically the controller 120 of the device 100. In the illustrated example, the instructions represented by the blocks of FIG. 4 are stored at the memory 122 for example, as the application 126. The method 400 of FIG. 4 is one way in which the controller 120 and/or the device 100 may be configured. Furthermore, the following discussion of the method 400 of FIG. 4 will lead to a further understanding of the device 100, and its various components.

The method 400 of FIG. 4 need not be performed in the exact sequence as shown and likewise various blocks may be performed in parallel rather than in sequence. Accordingly, the elements of method 400 are referred to herein as "blocks" rather than "steps." The method 400 of FIG. 4 may be implemented on variations of the device 100 of FIG. 1, as well.

In particular, the method 400 represents an output power control loop implemented by the controller 120. It is further understood that ring resonator modulator control for laser wavelength tracking, such as an insertion loss control loop, is being implemented (e.g. by the controller 120) as the method 400 is being implemented and that changes that occur to the laser current due to the method 400, for example to increase or decreased output power, may result in changes to the heater current in the ring resonator modulator control for laser wavelength tracking.

Furthermore, reference will be made hereafter to heater power overhead being available or unavailable to reduce heater power for laser wavelength tracking. Heater power overhead being available may be understood to include that the heater power may be reduced to above a lowest operational heater power in order to cause a presently used resonance peak of the ring resonator modulator 111 to track and/or follow and/or modulate the wavelength of the optical signal of the laser 101 as it undergoes a blue shift due to aging, temperature changes etc. Similarly, heater power overhead being unavailable may be understood to include that the heater power may need to be reduced to below a lowest operational heater power in order to cause a presently used resonance peak of the ring resonator modulator 111 to track and/or follow and/or modulate the wavelength of the optical signal of the laser 101 as it undergoes a blue shift due to aging, temperature changes etc., which is not generally possible.

In practice, the device 100 and/or the controller 120, to determine whether heater power overhead is available or unavailable, may compare a present heater power to a given low heater power value, such as the lowest operational limit and/or a value representing a small buffer heater power above (and/or greater than) the lowest operational limit; for example, if the lowest operational limit on the heater power is "0", the given low heater power value may be set to 0.1 mW (and/or any other suitable value), or a similar value expressed in terms of ADC units, to prevent the heater power from dropping to "0" and/or the lowest operational limit. When the heater power is greater than the given low heater power value, the device 100 and/or the controller 120 may determine that heater power overhead is available; and when the heater power is at the given low heater power value (or below when higher than the lowest operational limit), the device 100 and/or the controller 120 may determine that heater power overhead is unavailable. Indeed, in some examples, the device 100 and/or the controller 120 may reduce the heater power to track the wavelength of the laser 101, in a feedback loop (e.g. an insertion loss feedback loop) for laser wavelength tracking until the heater power overhead is unavailable.

At a block 401, the controller 120 determines whether output power of the device 100 is outside the target output power range, for example by comparing the output from the power monitor 115-1 with the target output power range as stored at the memory 122 and/or the application 126. The target output power range may be provided in units of "power", such as mW (milliwatts) and the like, and/or as values on an example scale of 0 to 255 (e.g. for 8 bits of Analog-to-digital converter resolution), and the like (e.g. similar to digital values to which signals from the photodiodes of the power monitors 115 may be converted); however, any suitable scale (e.g. more than 8 bits or fewer than 8 bits resolution) is within the scope of the present specification. Indeed, in all comparisons hereafter that include output from the power monitors 115, the corresponding compared parameters may be values on a scale of 0 to 255 and/or on a same scale as output from the power monitors 115, though any suitable values and/or scales are within the scope of the present specification.

When the output power of the device 100 is within the target output power range (e.g. a "NO" decision at the block 401), the block 401 is repeated until the output power of the device 100 is outside the target output power range (e.g. a "YES" decision at the block 401), for example due to drift in the output power of the laser 101, and the like. The output power of the device 100 being outside the target output power range may be due to the ring resonator modulator control for laser wavelength tracking and/or laser current drift, and/or temperature changes of the ring resonator modulator 111 and/or the laser 101, and the like.

At a block 403, the controller 120 determines whether the output power of the device 100 is greater than the target output power range (e.g. a "YES" decision at the block 403) or less than the target output power range (e.g. a "NO" decision at the block 403).

When the controller 120 determines that the output power of the device 100 is less than the target output power range (e.g. a "NO" decision at the block 403), it is understood that the controller 120 controls the attenuation of the VOA 117 and/or the laser current to cause the output power to increase (e.g. to be within the target output power range), as described hereafter.

In particular, when the controller 120 determines that the output power of the device 100 is less than the target output power range (e.g. a "NO" decision at the block 403), at a block 405, the controller 120 determines whether the heater power overhead of the heater 113 is available (e.g. a "YES" decision at the block 405) or unavailable (e.g. a "NO" decision at the block 405), for example by comparing the heater power currently being used to power the heater 113 with the given low heater power, as described above.

For example, as the controller 120 controls the heater power of the heater 113, the controller 120 is understood to have access to a current value of the heater power (e.g. as stored at the memory 122) as, for example, a last power to which the heater 113 was controlled (e.g. in ring resonator modulator control for laser wavelength tracking, such as in an insertion loss control loop for example). Hence, at the block 405, the current value of the heater power may be compared to the given low heater power and, the current value of the heater power is greater than the given low heater power, a "YES" decision occurs at the block 405, otherwise a "NO" decision occurs.

When the controller 120 determines that heater power headroom of the heater 113 is available and/or that the heater power is greater than the given low heater power (e.g. a "YES" decision at the block 405), at a block 407, the controller 120 determines whether the attenuation of the VOA 117 is greater than the given low VOA attenuation (e.g. a "YES" decision at the block 407) or at (or lower than) the given low VOA attenuation (e.g. a "NO" decision at the block 407).

It is understood that when the VOA 117 is at (or lower than) the given low VOA attenuation, the attenuation of the VOA 117 may not generally be lowered, but may be raised, in the output power control loop, but when the VOA 117 is greater than the given low VOA attenuation, the attenuation of the VOA 117 may be lowered or raised in the output power control loop.

At the block 407, when the VOA 117 is greater than the given low VOA attenuation (e.g. a "YES" decision at the block 407), at a block 409, the controller 120 controls attenuation of the VOA 117 (e.g. to decrease the attenuation), for example to increase the output power such that the output power is within the target output power range, for example in feedback loop with output from the power monitor 115-1. Put another way, a decrease in the attenuation of the VOA 117 generally causes the output power to increase. However, when the attenuation of the VOA 117 decreased to the given low VOA attenuation and the output power is still not within the target output power range, the controller 120 may stop implementing the block 409 and implement the block 411 described below.

Such control may not affect ring resonator modulator control for laser wavelength tracking and/or insertion loss of the ring resonator modulator 111 as the ratio of the output from the ring resonator modulator 111 to the input to the ring resonator modulator 111 should not be affected by attenuating the input to the ring resonator modulator 111 (e.g. such control does not affect the frequency of the laser 101, or the optical transfer function 203). Hence, when the block 409 is implemented (e.g. with or without the block 411), the controller 120 continues to monitor the output power at the block 401.

Put another way, the controller 120 may be further configured to, in response to determining that: the output power of the optical signal is lower than the target output power range (e.g. a "NO" decision at the block 403); the heater power overhead is available and/or that the heater power is greater than the given low heater power (e.g. a "YES" decision at the block 405); and the attenuation of the VOA is greater than a given low VOA attenuation (e.g. a "YES" decision at the block 407): decrease the attenuation of the VOA, for example such that the output power of the optical signal is controlled to be within the target output power range (e.g. the output power of the optical signal is increased to be within the target output power range).

Returning to the block 405 and the block 407, when the heater power overhead is unavailable and/or that the heater power is at or less than the given low heater power (e.g. a "NO" decision at the block 405), or the attenuation of the VOA 117 is at the given low VOA attenuation (e.g. a "NO" decision at the block 407 and/or when the given low VOA attenuation is reached at the block 409), the controller 120 implements a block 411 to increase the laser current of the laser 101, for example to control the output power to be within the target output power range. Such an increase in laser current may result in the heater power being increased for ring resonator modulator control for laser wavelength tracking, and in particular to bring the insertion loss into a target insertion loss range.

Put another way, in this example, as the output power is less than the target output power range, and/or as the attenuation of the VOA 117 can only be raised (which would have the result of further decreasing the output power), the controller 120 increases the laser current of the laser 101 to shift the optical transfer function 203, and may further control the heater power of the heater 113 to control the insertion loss in an insertion loss control loop, as determined via the output from the power monitors 115-1, 115-2. Put yet another way, increasing the laser current results in a laser wavelength "red" shift which could cause the heater power to increase in the insertion loss control loop.

Put another way, the controller 120 further configured to, in response to determining that: the output power of the optical signal is lower than the target output power range (e.g. a "NO" decision at the block 403); the heater power overhead is available and/or that the heater power is greater than the given low heater power (e.g. a "YES" decision at the block 405); and the attenuation of the VOA is less than or equal to a given low VOA attenuation (e.g. a "NO" decision at the block 407): increase the laser current, for example such that the output power of the optical signal is controlled to be within the target output power range (e.g. the output power of the optical signal is increased to be within the target output power range).

Put yet another way, the controller 120 may be further configured to, in response to determining that: the output power of the optical signal is lower than the target output power range (e.g. a "NO" decision at the block 403); and the heater power overhead is unavailable and/or that the heater power is at or less than the given low heater power (e.g. a "NO" decision at the block 405): increase the laser current, for example such that the output power of the optical signal is controlled to be within the target output power range (e.g. the output power of the optical signal is increased to be within the target output power range).

After the block 411, the controller 120 continues to implement the block 401 to continue to monitor the output power.

Indeed, it is understood that at the block 409 and/or the block 411, attenuation of the VOA 117 and/or laser current may not be controlled until output power is within the target output power range; rather, the method 400 may be implemented as a feedback loop such that the attenuation of the VOA 117 and/or laser current is controlled until, at the block 401, the output power is determined to be inside the target output power range.

Returning to the block 403, when the controller 120 determines that the output power is greater than the target output power range (e.g. a "YES decision at the block 403), at a block 413 the controller 120 determines whether the heater power overhead is available and/or that the heater power is greater than the given low heater power (e.g. a "YES" decision at the block 413), unavailable and/or that the heater power is at or less than the given low heater power (e.g. a "NO" decision at the block 413). The block 413 is generally similar to the block 405.

When the controller 120 determines that the heater power is unavailable and/or that the heater power is at or less than the given low heater power (e.g. a "NO" decision at the block 413), at the block 415 the controller 120 determines whether the ring resonator modulator control for laser wavelength tracking is on-target or off-target. For example, at the block 415, the controller 120 may determine whether insertion loss is inside (on-target) or outside (off-target) a target insertion loss control range.

When the controller 120 determines that the ring resonator modulator control for laser wavelength tracking is off-target, and/or that the insertion loss is outside a target insertion loss control range (e.g. a "NO" decision at the block 415), at a block 417, the controller 220 and/or the device 100 increases the laser current to assist with the ring resonator modulator control for laser wavelength tracking for example to cause a laser wavelength "red" shift which could cause the heater power to increase in the insertion loss control loop. However, such an increase in laser current may also increase the output power.

As such, at a block 419, the controller 120 controls the attenuation of the VOA 117 (e.g. increase attenuation to decrease the output power) to control the output power into a target output power range.

However, while the block 417 may generally result in the output power being increased, in some specific examples (e.g. depending on the alignment of the laser wavelength and the currently used resonance peak, for example the resonance peak FSR-1), the output power may be decreased; hence the block 419 may include increasing or decreasing attenuation of the VOA 117 to decrease or increase the output power. Indeed, in some examples, the block 419 may be optional as the block 417 may result in the output power being within the target output power range.

Put another way, in these examples, the controller 120 may be further configured to, in response to determining that the heater power overhead is unavailable and/or that the heater power is at or less than the given low heater power (e.g. a "NO" decision at the block 413) and determining that laser current is increased (e.g. at the block 417) to assist with ring resonator modulator control for laser wavelength tracking: control, using the one or more power monitors 115 (e.g. to monitor output power), attenuation of the VOA 117 to control the output power into a target output power range. It is understood that such control further occurs in response to the controller 120 determining, using the one or more power monitors 115, that the output power of the optical signal is greater than the target output power range (e.g. a "YES" decision at the block 403).

Such an increase of attenuation of the VOA 117 at the block 419, to offset the increase in output power by the increase in laser current in ring resonator modulator control for laser wavelength tracking, is in contrast to similar devices which lack a VOA as described above, which may operate at higher heater power overheads to allow for decreasing a resonance peak of the optical transfer function 203 to track to the lowest wavelength 203-Low.

Returning to the block 415, when the controller 120 determines that ring resonator modulator control is on-target and/or that the insertion loss is inside a target insertion loss range (e.g. a "YES" decision at the block 415), the controller 120 does not implement the block 417 but rather implements the block 419 to control the attenuation of the VOA 117 (e.g. increase attenuation to decrease output power) to control the output power to be within the target output power range.

Put another way, in these examples, the controller 120 is further configured to, in response to determining that: the output power of the optical signal is greater than the target output power range (e.g. a "YES" decision at the block 403); the heater power overhead is unavailable and/or that the heater power is at or less than the given low heater power (e.g. a "NO" decision at the block 413); and the ring resonator modulator control for laser wavelength tracking is on-target (e.g. a "YES" decision at the block 415): control (e.g. increase) the attenuation of the VOA 117 for example to control (e.g. decrease) the output power of the optical signal to be within the target output power range.

After the block 419, the controller 120 continues to implement the block 401 to monitor the output power.

Returning to the block 413, when the controller 120 determines that the heater power overhead is available and/or that the heater power is greater than the given low heater power (e.g. a "YES" decision at the block 413), the controller 120 implements a block 421 to decrease the laser current of the laser 101, such that the output power is decreased and to assist with the ring resonator modulator control of the laser wavelength tracking. The block 421 is similar to the block 411, however at the block 421 the laser current is decreased to decrease the output power. In some examples, the heater power may be decreased accordingly to decrease power usage by the device 100 and/or the heater power may be increased depending on the determined insertion loss, however such heater power control generally occurs in the ring resonator modulator control of the laser wavelength tracking and/or an insertion loss control loop.

While, in other examples, at the block 421, the attenuation of the VOA 117 may be increased to decrease output power, the controller 120 generally controls the components of the device 100 to reduce power usage when such reduction is available (e.g. the heater power overhead is available and/or that the heater power is greater than the given low heater power).

Put another way, in these examples, the controller 120 may be further configured to, in response to determining that the output power of the optical signal is greater than the target output power range (e.g. a "YES" decision at the block 403) and that the heater power overhead is available and/or that the heater power is greater than the given low heater power (e.g. a "YES" decision at the block 403): decrease the laser current.

After the block 421, the controller 120 continues to implement the block 401 to monitor the output power.

Indeed, it is understood that at the block 419 and/or the block 421, attenuation of the VOA 117 and/or laser current may not be controlled until output power is within the target output power range; rather, the method 400 may be implemented as a feedback loop such that the attenuation of the VOA 117 and/or laser current is controlled until, at the block 401, the output power is determined to be inside the target output power range. Indeed, it is further understood that implementation of such a feedback loop may result in the block 419 and/or the block 421 being implemented when implementation of the block 409 and/or the block 411 caused the output power to be greater than the output power range.

While the method 400 has been described with respect to the device 100, and the VOA 117 being located prior to the ring resonator modulator 111 on the optical waveguide 103, relative to the output 107, in other examples the VOA 117 may be located after the ring resonator modulator 111 on the optical waveguide 103, relative to the output 107. Put another way, the VOA 117 may be located before or after the ring resonator modulator 111 on the optical waveguide 103.

Figure 5:
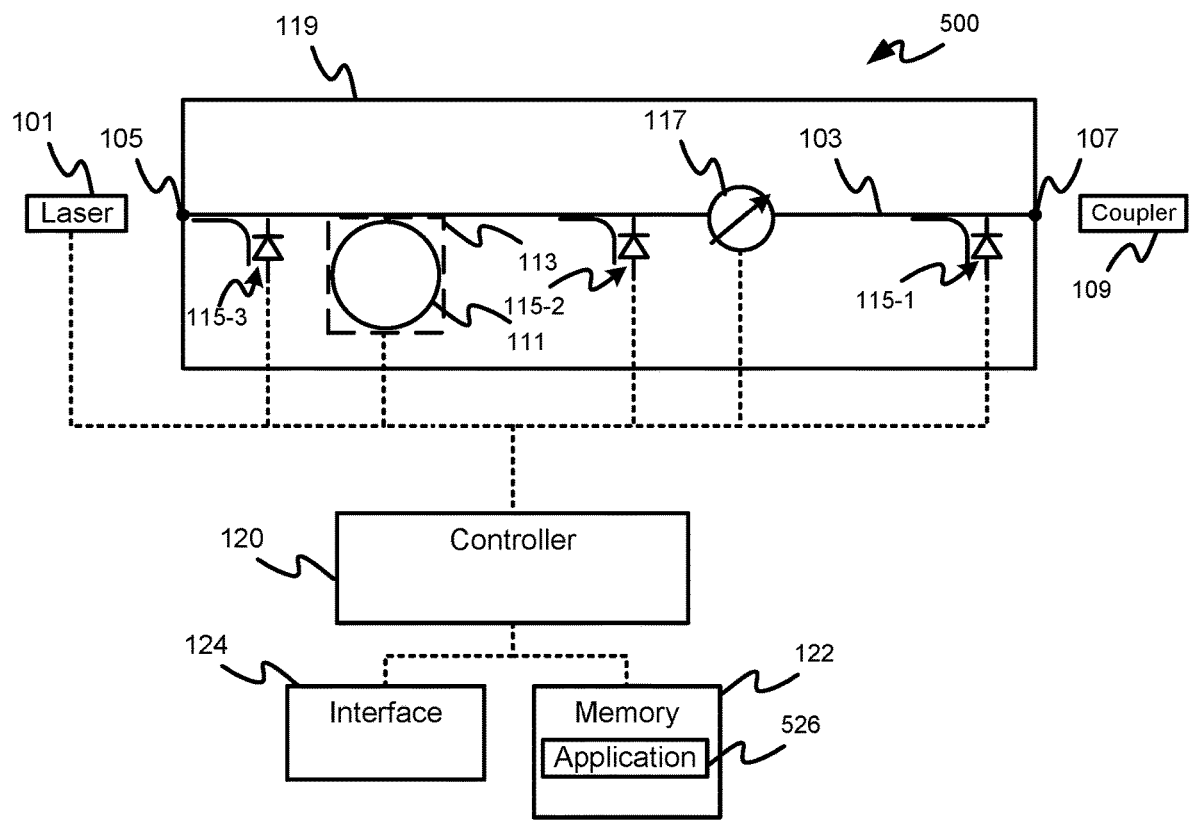
FIG. 5 depicts another example device with variable optical attenuator assisted control, in accordance with some alternative examples.

For example, attention is next directed to FIG. 5 which depicts a device 500 that is substantially similar to the device 100, with like components having like numbers. However, in contrast to the device 100, at the device 500, the VOA 117 is located after the ring resonator modulator 111 on the optical waveguide 103, relative to the output 107, and ring resonator modulator 111 is located between the power monitors 115-2, 115-3. As such, the controller 120 may use output from the power monitors 115-2, 115-3 to determine insertion loss in the device 100, and output from the power monitor 115-1 to determine output power; as such, the application 126 is replaced with an application 526, that is similar to the application 126, other than to specify the power monitors 115 used to monitor insertion loss and output power. Furthermore, in these examples, the power monitor 115-3 may not be optional (e.g. in comparison to the power monitor 115-3 of the device 100). The device 500 otherwise implements the method 400 as described above.

However, it is understood that the devices 100, 500 are merely two examples of devices which can use a VOA to implement an output power control loop, in tandem with an insertion loss control loop, to control output power. Put another way, an arrangement of a VOA, a ring resonance modulator, and power monitors on an optical waveguide may be in any suitable configuration and may include more than one ring resonance modulator and/or more than one VOA.

In some examples, the method 400 may be adapted for use with devices that include a plurality of devices similar to the device 100 (and/or the device 500 and/or a similar device).

Figure 6:
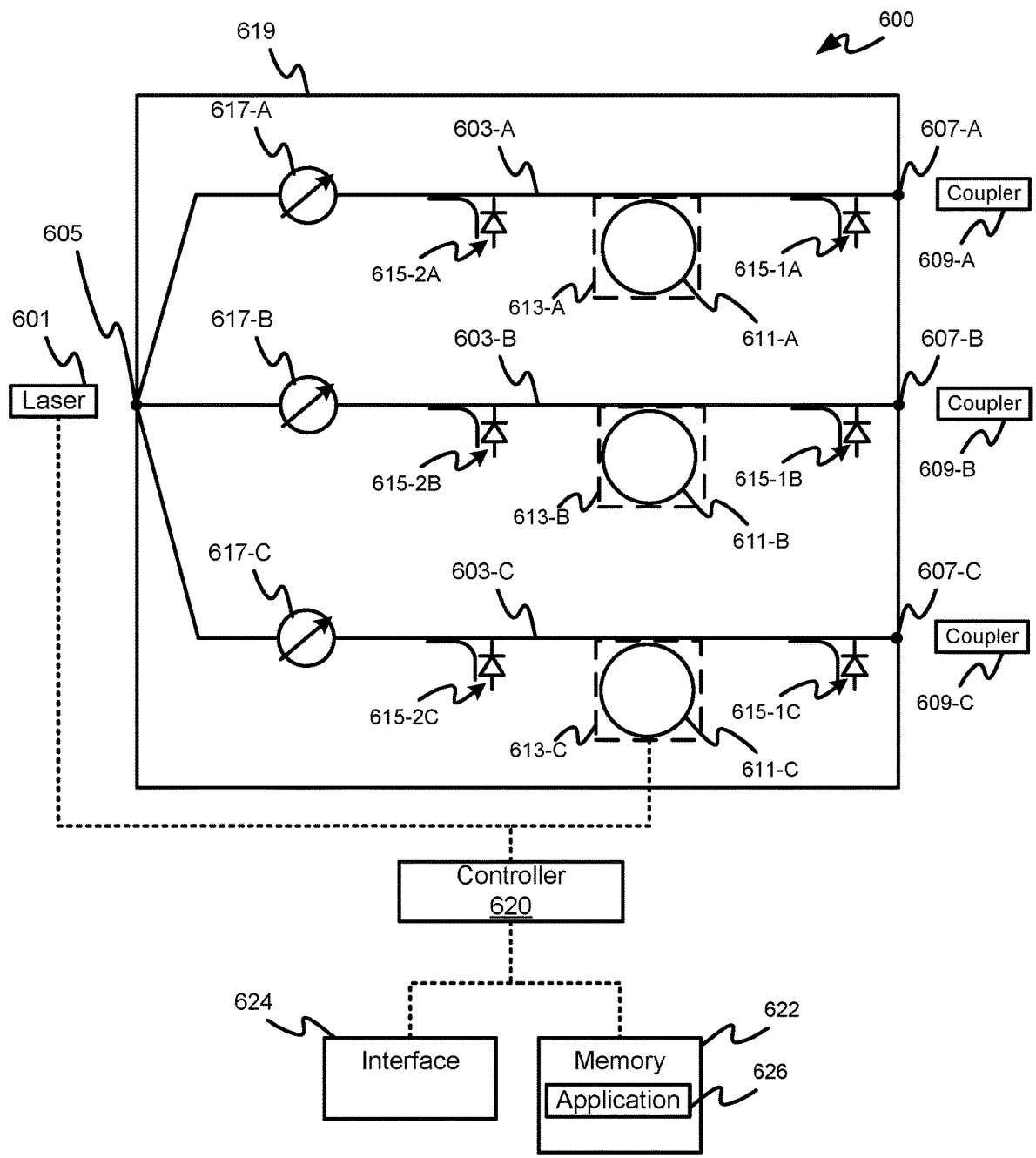
FIG. 6 depicts another example device with a plurality of ring resonator modulator, in accordance with some alternative examples.

For example, attention is next directed to FIG. 6 which depicts a device 600 that is substantially similar to the device 100, with like components having like numbers but in a "600" series rather than a "100" series. For example the device 600 includes a laser 601 that is substantially similar to the laser 101. However, in contrast to the device 100, the device 600 includes a plurality of optical waveguides, ring resonator modulators (controlled via individual heaters), VOAs and power monitors, as described hereafter. While the device 600 is described with respect to three optical waveguides, and corresponding components, the device 600 may include any suitable number of optical waveguides and corresponding components (e.g. as few as two optical waveguides and corresponding components, or more than three optical waveguides and corresponding components, etc.).

In particular, the device 600 comprises a plurality of optical waveguides 603-A, 603-B, 603-C configured to: receive an optical signal from the laser 601 at a common input 605 as respective optical signals; and convey the respective optical signals to respective outputs 607-A, 607-B, 607-C. The plurality of optical waveguides 603-A, 603-B, 603-C are interchangeably referred to hereafter, collectively, as the waveguides 603 and, generically, as a waveguide 603. A similar numbering convention will be used hereafter; for example the outputs 607-A, 607-B, 607-C are interchangeably referred to hereafter to as the outputs 607 and an output 607.

Hence, the waveguides 603 include a common input 605, such as a suitable beamsplitter, and the like, which divides an optical signal from the common laser 601 to the waveguides 603, and the outputs 607 output a respective output signal to a respective optical coupler 609-A, 609-B, 609-C (e.g. couplers 609 and/or a coupler 609). The couplers 609 may comprise respective single mode fiber couplers.

The device 600 further comprises: respective ring resonator modulators 611-A, 611-B, 611-C (e.g. ring resonator modulators 611 and/or a ring resonator modulator 611) on the plurality of optical waveguides 603. In general, the ring resonator modulators 611 are understood to be uncooled. The ring resonator modulators 611 are further understood to have same and/or similar dimensions such that each operate in a similar manner; for example, the ring resonator modulators 611 are understood to have a similar optical transfer function (e.g. such as the optical transfer function 203), similar transmission magnitude profiles (e.g. such as the transmission magnitude profiles 301, 302), and each are controlled to modulate the same frequency of the optical signal from the laser 601.

The device 600 further comprises plurality of heaters 613-A, 613-B, 613-C (e.g. heaters 613 and/or a heater 613) configured to heat a respective ring resonator modulator 611. While not depicted, it is understood that modulation of the ring resonator modulators 611 are controlled by respective voltage control devices.

In general, each optical waveguide 603 and ring resonator modulator 611 may correspond to an individual channel and/or data channel being output at a respective output 607.

The device 600 further comprises respective power monitors on the plurality of optical waveguides 603. As depicted, the optical waveguide 603-A includes power monitors 615-1A, 615-2A at similar respective positions as the power monitors 115-1, 115-2; similarly, the optical waveguide 603-B includes power monitors 615-1B, 615-2B and the optical waveguide 603-C includes power monitors 615-1C, 615-2C. While no power monitors at respective positions similar to that of the power monitor 115-3 are depicted, one or more of such power monitors may be present but are understood to be optional. The power monitors 615-1A, 615-2A, 615-1B, 615-2B, 615-1C, 615-2C are referred to hereafter as the power monitors 615 and/or as a power monitor 615. The power monitors 615-1A, 615-1B, 615-1C are referred to hereafter as the power monitors 615-1 and/or as a power monitor 615-1, and the power monitors 615-2A, 615-2B, 615-2C are referred to hereafter as the power monitors 615-2 and/or as a power monitor 615-2.

In general, the respective power monitors 615 are configured to monitor: respective insertion loss on the plurality of optical waveguides 603 due to a respective ring resonator modulator 611; and respective output power of the respective optical signals. For example, a respective ratio of output from respective power monitors 615-1, 615-2 may be used to monitor respective insertion loss on a respective optical waveguides 603, and respective power monitor 615-1 may be used to monitor respective output power on a respective optical waveguides 603.

As depicted, the device 600 further comprises respective VOAs 617-A, 617-B, 617-C (e.g. VOAs 617 and/or a VOA 617) configured to attenuate the respective optical signals on the plurality of optical waveguides 603.

As depicted, the optical components of the device 600, other than the laser 601, may be fabricated on a common PIC 619.

Furthermore, the input signal from the laser 601 is generally split between the optical waveguides 603 at the input 605, and independently modulated by respective ring resonator modulators 611 to generate respective modulated output signals.

As depicted, the device 600 further comprises a controller 620, a memory 622 and a communication interface 624, the memory 622 storing an application 626. While electrical links between the controller 620, the laser 601, and the heater 613 are depicted, for simplicity, links that include flow of electrical data and/or electrical signals between the controller 620 and optical components on the PIC 619 are not depicted. It is nonetheless understood that the controller 620 is in communication with the power monitors 615, the VOAs 617, and the corresponding voltage control devices of the ring resonator modulators 611.

Further, the controller 620 is adapted to implement respective ring resonator modulator control for respective laser wavelength tracking (e.g. respective insertion loss control loops) for the ring resonator modulators 611, via the respective heaters 613, and respective ratios of outputs from the respective power monitors 615-1, 615-2 (e.g. to monitor respective insertion loss). Put another way, as the ring resonator modulators 611 share a common laser 601, resonator modulator and/or insertion loss control generally occurs via the individual heaters 613 on a "per channel basis". Similarly, output power control may occur on a "per channel basis".

However, as the device 600 includes only one laser 601, as the controller 620 is implementing the method 400, decisions to change the laser current and/or change the attenuation of the VOA 617 is generally based on all channels. For example, when the output power on one channel (e.g. at one output 607) is higher than the target output power range, unless all the heaters 613 have available heater power overhead (e.g. all the heaters 613 are at a respective heater power greater than the given low heater power), the laser current cannot be reduced. As such, all the heaters 613 and ring resonator modulators 611 are generally controlled to be operating using a respective resonance peak FSR-1 (e.g. having a lowest heater power overhead) and when the laser current is increased at the block 417 to improve laser wavelength tracking for one of the ring resonator modulators 611 (e.g. when the output power for one of the outputs 607 is greater than the target output power range, for example as determined at the block 403), the respective VOAs 617 are used to compensate for the resulting higher output power at the respective outputs 607. In the other case, when the output power is lower than the target output power range (for example as determined at the block 403), as long as one of the VOAs 617 is at the given low VOA attenuation, a laser current increase occurs at the block 411 (e.g. a "NO" decision for at the block 407 occurs when one of the VOAs 617 is at the given low VOA attenuation).

The method 400 as implemented at the controller 620 is next described in more detail with respect to ring resonator modulator control being described with respect to use of insertion loss monitoring.

Hence, while the controller 620 is generally configured to implement the method 400, to individually control the respective output power at the respective outputs 607 via respective output power control loops, changes that the controller 620 makes to the laser current, to control the output power, generally affect the insertion loss at all the ring resonator modulators 611. Hence, at the blocks 411, 417, 421, the insertion loss may be controlled for all the resonator modulators 611. Similarly, drift of insertion loss on one ring resonator modulator 611 (e.g. as determined at the block 415), may lead to all the ring resonator modulators 611 being controlled at the blocks 411, 417, 421 to bring the respective insertion loss of all the resonator modulators 611 to within a target insertion loss range on a per-channel basis.

For example, the controller 620 may be configured to: in response to determining that a respective heater power overhead for a given ring resonator modulator 611, on a given optical waveguide 603, is unavailable (e.g. a respective heater power is at a lowest operational heater power and/or at (or below) a given low heater power) and determining that the laser current is increased to assist with respective ring resonator modulator control for respective laser wavelength tracking for the given ring resonator modulator 611: control, using the one or more power monitors 615, attenuation of a respective VOA 617 on the given optical waveguide to control respective output power on the given optical waveguide 604 into the target outpower range. As such, the advantage of using a VOA to reduce overall power usage is increased relative to the number of channels at the device 600.

In yet a further particular example, when output power at one of the outputs 607 is greater than the target output power range (e.g. a "YES" decision at the block 403), and when a respective heater power overhead is unavailable and/or that the respective heater power is at or less than the given low heater power (e.g. a "NO" decision at the block 413), and presuming that the insertion loss is within the insertion loss target range (e.g. a "YES" decision at the block 415) rather than increase the heater power of the heater 613, the controller 620 increases (e.g. at the block 419) the attenuation of one or more of respective VOAs 617 until the respective output power of the respective optical signals is within the target output power range.

In this specification, elements may be described as "configured to" perform one or more functions or "configured for" such functions. In general, an element that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, XZ, and the like). Similar logic can be applied for two or more items in any occurrence of "at least one . . . " and "one or more . . . " language.

The terms "about", "substantially", "essentially", "approximately", and the like, are defined as being "close to", for example as understood by persons of skill in the art. In some examples, the terms are understood to be "within 10%," in other examples, "within 5%", in yet further examples, "within 1%", and in yet further examples "within 0.5%".

Persons skilled in the art will appreciate that in some examples, the functionality of devices and/or methods and/or processes described herein can be implemented using pre-programmed hardware or firmware elements (e.g., application specific integrated circuits (ASICs), electrically erasable programmable read-only memories (EEPROMs), etc.), or other related components. In other examples, the functionality of the devices and/or methods and/or processes described herein can be achieved using a computing apparatus that has access to a code memory (not shown) which stores computer-readable program code for operation of the computing apparatus. The computer-readable program code could be stored on a computer readable storage medium which is fixed, tangible and readable directly by these components, (e.g., removable diskette, CD-ROM, ROM, fixed disk, USB drive). Furthermore, it is appreciated that the computer-readable program can be stored as a computer program product comprising a computer usable medium. Further, a persistent storage device can comprise the computer readable program code. It is yet further appreciated that the computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof Persons skilled in the art will appreciate that there are yet more alternative examples and modifications possible, and that the above examples are only illustrations of one or more embodiments. The scope, therefore, is only to be limited by the claims appended hereto.

What is claimed is:

1. A device comprising:
   a laser configured to produce an optical signal;
   an optical waveguide configured to: receive the optical signal at an input; and convey the optical signal to an output;
   a ring resonator modulator configured to modulate the optical signal on the optical waveguide, wherein the laser and the ring resonator modulator are uncooled;
   a heater configured to heat the ring resonator modulator;
   a variable optical attenuator (VOA) configured to attenuate the optical signal on the optical waveguide;
   one or more power monitors configured to monitor: modulation of the optical signal on the optical waveguide; and output power of the optical signal; and
   a controller configured to:
      initially select a heater power to operate the heater to select a resonance peak of an optical transfer function of the ring resonator modulator that minimizes heater power overhead, the heater power overhead comprising a difference between a current heater power and a lowest operational heater power; and
      in response to: determining that one or more of: the heater power overhead is unavailable to reduce heater power for laser wavelength tracking; and the heater power is at or below a given lower heater power; and determining that laser current is increased to assist with ring resonator modulator control for the laser wavelength tracking:
         control, using the one or more power monitors, attenuation of the VOA to control the output power into a target output power range.

2. The device of claim 1, wherein the controller is further configured to control one or more of the attenuation of the VOA and the laser current of the laser, based on one or more of:
   the output power being greater or less than the target output power range;
   the heater power being greater than the given lower heater power, or at or below the given lower heater power;
   the heater power overhead being available or unavailable;
   an insertion loss on the optical waveguide being within a target insertion loss range; and
   the attenuation of the VOA being greater than a given low VOA attenuation.

3. The device of claim 1, wherein the controller is further configured to control the attenuation of the VOA, to control the output power into the target output power range, in further response to determining, using the one or more power monitors, that the output power of the optical signal is greater than the target output power range.

4. The device of claim 1, wherein the controller is further configured to, in response to determining that one or more of: the heater power overhead is unavailable; and the heater power is at or below the given lower heater power:
   increase the laser current to assist with the ring resonator modulator control for the laser wavelength tracking.

5. The device of claim 1, wherein the controller is further configured to, in response to determining that the output power of the optical signal is greater than the target output power range and that one or more of: the heater power overhead is available; and the heater power greater than the given lower heater power:
   decrease the laser current.

6. The device of claim 1, wherein the controller is further configured to, in response to determining that: the output power of the optical signal is lower than the target output power range; one or more of the heater power overhead is available and the heater power greater than the given lower heater power; and the attenuation of the VOA is greater than a given low VOA attenuation:
   decrease the attenuation of the VOA.

7. The device of claim 1, wherein the controller is further configured to, in response to determining that: the output power of the optical signal is lower than the target output power range; one or more of the heater power overhead is available and the heater power greater than the given lower heater power; and the attenuation of the VOA is less than or equal to a given low VOA attenuation:
   increase the laser current.

8. The device of claim 1, wherein the controller is further configured to, in response to determining that: the output power of the optical signal is lower than the target output power range; and one or more of the heater power overhead is unavailable and the heater power is at or below the given lower heater power:
   increase the laser current.

9. The device of claim 1, wherein the VOA is located before or after the ring resonator modulator on the optical waveguide.

10. The device of claim 1, further comprising:
    a plurality of optical waveguides configured to: receive the optical signal at respective inputs as respective optical signals; and convey the respective optical signals to respective outputs;
    respective ring resonator modulators on the plurality of optical waveguides, wherein the respective ring resonator modulators are uncooled;

a plurality of heaters configured to heat the respective ring resonator modulators;
respective power monitors on the plurality of optical waveguides, the respective power monitors configured to monitor: respective modulation of the respective optical signals on the plurality of optical waveguides; and respective output power of the respective optical signals; and
respective VOAs configured to attenuate the respective optical signals on the plurality of optical waveguides,
wherein the controller is further configured to:
in response to:
    determining one or more of: that a respective heater power overhead, for a given ring resonator modulator, on a given optical waveguide, is unavailable; and a respective heater power is at or below the given lower heater power, and
    determining that the laser current is increased to assist with respective ring resonator modulator control for respective laser wavelength tracking for the given ring resonator modulator:
        control, using the one or more power monitors, attenuation of a respective VOA on the given optical waveguide to control respective output power on the given optical waveguide into the target output power range.

11. A method comprising:
initially selecting, at a controller of a device, a heater power to operate a heater of the device to select a resonance peak of an optical transfer function of a ring resonator modulator of the device that minimizes heater power overhead, the heater power overhead comprising a difference between a current heater power and a lowest operational heater power; and
in response to: determining, at the controller of the device, that one or more of: heater power overhead is unavailable to reduce heater power for laser wavelength tracking; and the heater power is at or below a given lower heater power; and determining that laser current is increased to assist with ring resonator modulator control for the laser wavelength tracking:
    controlling, using one or more power monitors of the device configured to monitor output power, attenuation of a variable optical attenuator (VOA) to control the output power into a target output power range,
the device comprising: a laser configured to produce an optical signal; an optical waveguide configured to: receive the optical signal at an input; and convey the optical signal to an output; the ring resonator modulator configured to modulate the optical signal on the optical waveguide, wherein the laser and the ring resonator modulator are uncooled; the heater configured to heat the ring resonator modulator; the VOA configured to attenuate the optical signal on the optical waveguide; one or more power monitors configured to monitor: modulation of the optical signal on the optical waveguide; and the output power of the optical signal; and the controller.

12. The method of claim 11, further comprising controlling one or more of the attenuation of the VOA and the laser current of the laser, based on one or more of:
the output power being greater or less than the target output power range;
the heater power being greater than the given lower heater power, or at or below the given lower heater power;
the heater power overhead being available or unavailable;
an insertion loss on the optical waveguide being within a target insertion loss range; and
the attenuation of the VOA being greater than a given low VOA attenuation.

13. The method of claim 11, further comprising controlling the attenuation of the VOA, to control the output power into the target output power range, in further response to determining, using the one or more power monitors, that the output power of the optical signal is greater than the target output power range.

14. The method of claim 11, further comprising, in response to determining that one or more of: the heater power overhead is unavailable; and the heater power is at or below the given lower heater power:
increasing the laser current to assist with the ring resonator modulator control for the laser wavelength tracking.

15. The method of claim 11, further comprising, in response to determining that the output power of the optical signal is greater than the target output power range and that one or more of: the heater power overhead is available; and the heater power greater than the given lower heater power:
decreasing the laser current.

16. The method of claim 11, further comprising, in response to determining that:
the output power of the optical signal is lower than the target output power range; one or more of the heater power overhead is available and the heater power greater than the given lower heater power; and the attenuation of the VOA is greater than a given low VOA attenuation:
decreasing the attenuation of the VOA.

17. The method of claim 11, further comprising, in response to determining that:
the output power of the optical signal is lower than the target output power range; one or more of the heater power overhead is available and the heater power greater than the given lower heater power; and the attenuation of the VOA is less than or equal to a given low VOA attenuation:
increasing the laser current.

18. The method of claim 11, further comprising, in response to determining that:
the output power of the optical signal is lower than the target output power range; and one or more of the heater power overhead is unavailable and the heater power is at or below the given lower heater power:
increasing the laser current.

19. The method of claim 11, further comprising, when the device comprises a plurality of ring resonator modulators, respectively heated by a plurality of heaters, on a plurality of optical waveguides, with a plurality of VOAs on the plurality of optical waveguides, with the laser providing a respective optical signal to the plurality of optical waveguides:
in response to:
    determining one or more of: that a respective heater power overhead, for a given ring resonator modulator, on a given optical waveguide, is unavailable; and a respective heater power is at or below the given lower heater power, and
    determining that the laser current is increased to assist with respective ring resonator modulator control for respective laser wavelength tracking for the given ring resonator modulator:
        controlling, using the one or more power monitors, attenuation of a respective VOA on the given optical waveguide to control respective output power on the given optical waveguide into the target output power range.

\* \* \* \* \*